US007226303B2

(12) United States Patent
Shaikh

(10) Patent No.: US 7,226,303 B2
(45) Date of Patent: Jun. 5, 2007

(54) APPARATUS AND METHODS FOR SEALING A HIGH PRESSURE CONNECTOR

(75) Inventor: Farhat Shaikh, Houston, TX (US)

(73) Assignee: Baker Hughes Incorporated, Houston, TX (US)

( * ) Notice: Subject to any disclaimer, the term of this patent is extended or adjusted under 35 U.S.C. 154(b) by 0 days.

(21) Appl. No.: 11/062,383

(22) Filed: Feb. 22, 2005

(65) Prior Publication Data

US 2006/0189208 A1 Aug. 24, 2006

(51) Int. Cl.
*H01R 13/52* (2006.01)

(52) U.S. Cl. ...................................................... 439/283

(58) Field of Classification Search ................ 439/283, 439/559, 284; 174/151, 18
See application file for complete search history.

(56) References Cited

U.S. PATENT DOCUMENTS 1,484,335 A * 2/1924 Kerrigan ...................... 315/36
2,150,723 A * 3/1939 Nowosielski ............... 439/127
3,352,963 A * 11/1967 Homrig ...................... 174/151
3,793,608 A 2/1974 Ring et al.
3,898,731 A 8/1975 Ring et al.
4,436,950 A * 3/1984 Gaffal et al. ............ 174/11 BH
5,203,723 A 4/1993 Ritter
2001/0007802 A1 7/2001 Homer
2001/0039144 A1 11/2001 Osawa et al.
2002/0028603 A1 3/2002 Murakami et al.
2003/0166359 A1 9/2003 Maue et al.
2003/0207615 A1 11/2003 Oota e tal.
2005/0112942 A1 5/2005 Shah

* cited by examiner

*Primary Examiner*—Phuong Dinh
(74) *Attorney, Agent, or Firm*—Madan, Mossman & Sriram, P.C.

(57) ABSTRACT

An electrical connector for use in downhole environment and methods for use are provided. In one aspect, an electrical connector comprises a substantially cylindrical connector body having a first end and a second end. A groove is formed around an outer surface of the connector body wherein the groove has a first substantially conically beveled surface on a side of the groove proximate the second end. A back-up ring has a second substantially conically beveled surface and is adapted to act cooperatively with an elastomer seal to close an extrusion gap between the connector body and a surrounding surface when the elastomer seal is exposed to a positive differential pressure from the first end to the second end. In another aspect, a conical surface on the connector body is forced to engage a mating surface on a bulkhead, thereby forming a metal to metal seal.

10 Claims, 4 Drawing Sheets

APPARATUS AND METHODS FOR SEALING A HIGH PRESSURE CONNECTOR

BACKGROUND OF THE INVENTION

1. Field of the Invention

The present invention pertains to energy connectors and more particularly to connectors for high pressure environments.

2. Related Prior Art

Tools used in drilling, logging, and producing oil wells commonly consist of various electronic instruments and circuits contained at atmospheric pressure within one or more pressure housings in the downhole tools. The surrounding downhole environment may exhibit pressures up to 30,000 psi at temperatures up to 500 F. The electronics inside the pressure housings require a hermetic type electrical connector that interconnects the electrical circuits in the separate housings and/or with electrical conductors in a wireline to maintain communications with electronic instruments at the surface. The connectors must easily connect and disconnect and function as electrical conductors in extreme hostile liquid environments such as brine, oil base drilling mud and fluids that may contain hydrogen sulfide, carbon dioxide, methane, and other elements at the extreme downhole ambient conditions. The connectors may carry substantial amounts of power with signals of several hundred volts being common.

A typical single pin type connector to which aspects of the invention pertain includes a conductive pin surrounded by an insulating material which in turn is encased in a metal body. Two types of construction are generally used. In one type, the center pin is insulated and bonded in place with the outer metal body by a fused glass insert located at some distance from each end of the metal body. A ceramic insulator is then inserted in the ends and bonded in place with an epoxy adhesive. The fused glass functions both as an insulator and as a hermetic seal. In another type of construction, the center pin is insulated from the outer metal body by a one piece ceramic insulator that is bonded to the pin and metal body with a metallic brazing material. In this case, the ceramic material functions as the insulator and the braze functions as the hermetic seal. This device generally represents the prior art devices now in use. Examples of such connectors are included in U.S. Pat. Nos. 3,793,608 and 3,898,731, each of which is incorporated herein by reference. Commercial connectors of this type are available from Kemlon Products, Pearland, Tex. A plastic bodied connector of somewhat similar construction is described in U.S. Pat. No. 5,203,723, which is incorporated herein by reference.

An outline of a typical connector as described above is shown in FIG. 1, where connector 4 has a conductor pin 2 that extends through connector body 1 and is internally configured and sealed as described above. Connector 4 is commonly screwed into a closely dimensioned port in bulkhead 7 (see FIG. 2) such that elastomer o-ring 8 in groove 3 is compressed between the groove 3 and an inner diameter surface 11 of the port to prevent the passage of high pressure fluid 10 past o-ring seal 8 and contaminate the interior atmospheric pressure area 15. As is common in high pressure applications, back-up ring 9 may be inserted in the groove to prevent the extrusion of elastomer o-ring 8 into the gap between housing 1 and surface 11. The effectiveness of back-up rings at high pressures and temperatures is critical to the proper operation of this type of sealing configuration. Back up ring 9 is commonly spirally cut, also called a scarf cut, such that it may be collapsed to the outer diameter of groove 3 during installation. Then, high pressure fluid 10 acting on o-ring 8 is used to force back-up ring 9 to extend out past the edge of groove 3 to contact surface 11 and prevent extrusion of o-ring 8. At high pressure, it is common for o-ring 8 to exert a large axial force on back-up ring 9 such that the friction between back-up ring 9 and the wall of groove 3 is too great to allow sufficient movement of back-up ring 9 to close the gap between the connector and surface 11. This leads to extrusion of o-ring 8 and commonly failure of the seal. This allows downhole fluid 10 to penetrate the atmospheric area 15 with catastrophic consequences. It is also common for personnel to install the back-up rings on the wrong side of the o-ring such that there is no tendency for the back-up ring to be properly actuated.

There is a demonstrated need for a highly reliable connector seal for high pressure high temperature environments. The present invention addresses these and other shortcomings of the prior art described above.

SUMMARY OF THE INVENTION

The present invention provides an electrical connector for use in downhole environment. In one aspect, the invention provides an electrical connector, comprising a substantially cylindrical connector body having a first end and a second end. A groove is formed around an outer surface of the connector body wherein the groove has a first substantially conically beveled surface on a side of the groove proximate the second end. A back-up ring has a second substantially conically beveled surface and is adapted to act cooperatively with an elastomer seal to close an extrusion gap between the connector body and a surrounding surface when the elastomer seal is exposed to a positive differential pressure from the first end to the second end.

In another aspect, an electrical connector system comprises a substantially cylindrical connector body having a first substantially conical surface formed on a first end of the connector body. A second substantially conical surface is formed in a port of a bulkhead. A locking nut is threadedly engagable with the bulkhead such that the locking nut forces the first conical surface in contact with the second conical surface to form a seal when the locking nut is engaged with the bulkhead.

In another aspect, the present invention provides a method of sealing an electrical connector in a downhole environment by providing a substantially cylindrical connector body having a first end and a second end. A groove is formed around an outer surface of the connector body, the groove having a first substantially conically beveled surface on a side of the groove proximate the second end. A back-up ring is provided that has a second substantially conically beveled surface and is adapted to act cooperatively with an elastomer seal to close an extrusion gap between the connector body and a surrounding surface when the elastomer seal is exposed to a positive differential pressure from the first end to the second end.

In yet another aspect, the present invention provides a method of sealing an electrical connector in a downhole environment, comprising providing a substantially cylindrical connector body. A first substantially conical surface is formed on a first end of the connector body. A second substantially conical surface in a port of a bulkhead. A locking nut is engaged with the bulkhead, wherein the locking nut engagement forces the first conical surface in contact with the second conical surface to form a seal. These and other aspects of the present invention are more clearly described in the drawings and specification that follows.

BRIEF DESCRIPTION OF THE DRAWINGS

For detailed understanding of the present invention, references should be made to the following detailed description of the preferred embodiment, taken in conjunction with the accompanying drawings, in which like elements have been given like numerals and wherein.

DESCRIPTION

Figure 3:
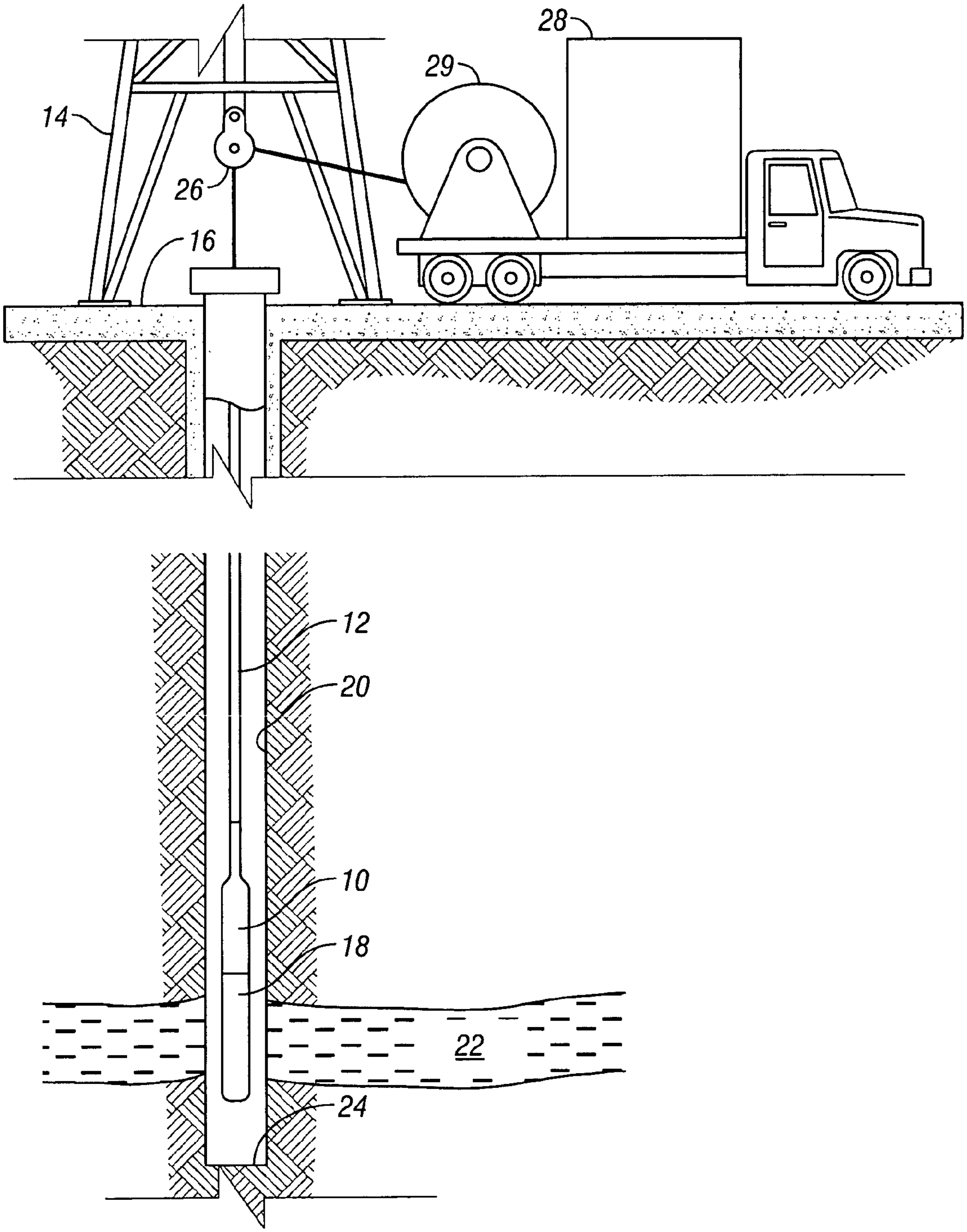
FIG. 3 (Prior Art)
FIG. 3 is a sketch of a common wireline logging system.

Referring initially to FIG. 3, there is shown a cable head 10 supported by a wireline 12 from a rig 14 at the surface 16. The releasable cable head 10 supports a tool string 18 disposed adjacent a production zone 22 located, for example, near the bottom 24 of a borehole 20, also called a wellbore. Wireline 12 is deployed from a reel 29 on wireline vehicle 28 around one or more sheave wheels 26 down borehole 20. Wireline vehicle 28 has instrumentation, well known in the art, for communication and control of cable head 10 and tool string 18.

Wireline 12, sometimes referred to as a cable, typically includes a plurality of electrical conductors extending from wireline vehicle 28 to cable head 10, all well known in the art. One such type of multi-conductor wireline 12 includes an inner core of seven electrical conductors covered by an insulating wrap. An inner and outer steel armor sheath is then wrapped in a helix in opposite directions around the conductors. The electrical conductors are used for communicating power and telemetry between wireline vehicle 28 and tool string 18. Alternatively, the wireline cable may contain a combination of electrical conductors and optical fibers. A single electrical conductor cable may also be used. Tool string 18 may include multiple logging tools, perforating guns, packers, and/or any other device suitable for running on a wireline and performing downhole operations. The downhole tools may be exposed to fluid pressures up to 30,000 psi and temperatures up to 500 F. The downhole fluid may be brine, water based drilling fluid, oil base drilling fluid and/or fluids that may contain hydrogen sulfide, carbon dioxide, methane, and other deleterious compounds.

Figure 1:
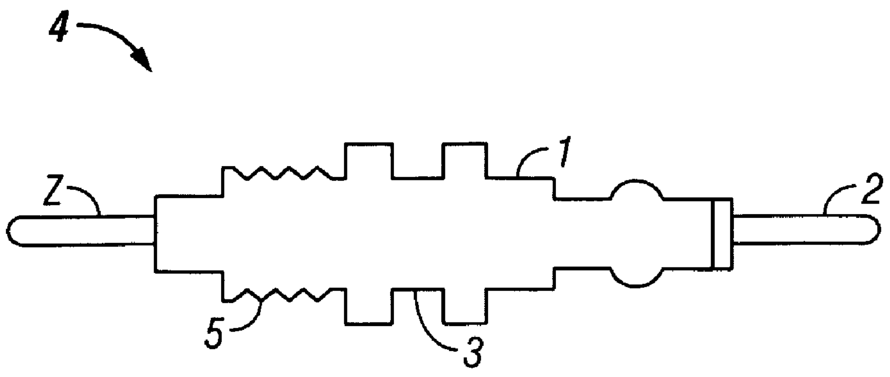
FIG. 1 (Prior Art)
FIG. 1 is a sketch of a prior art connector.
Figure 2:
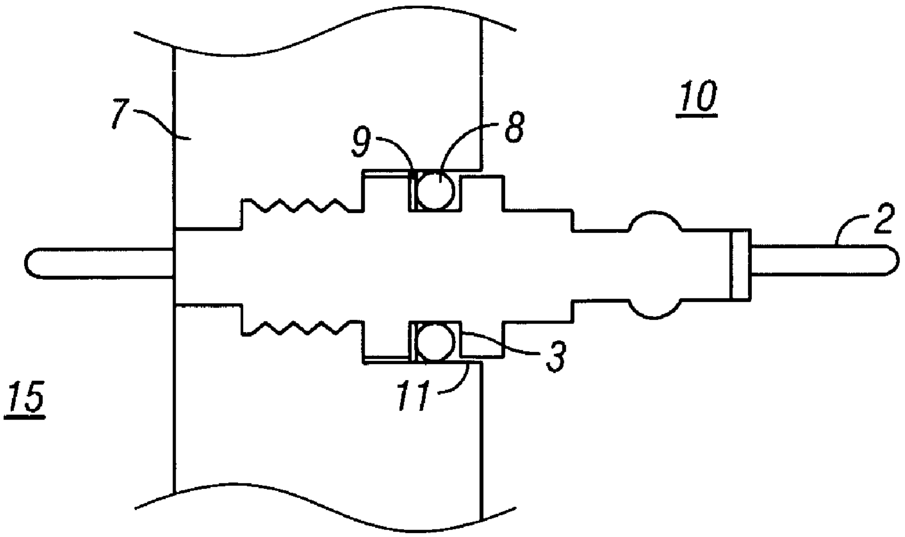
FIG. 2 (Prior Art)
FIG. 2 is a sketch of a prior art connector with a conventional back-up ring.
Figure 4:
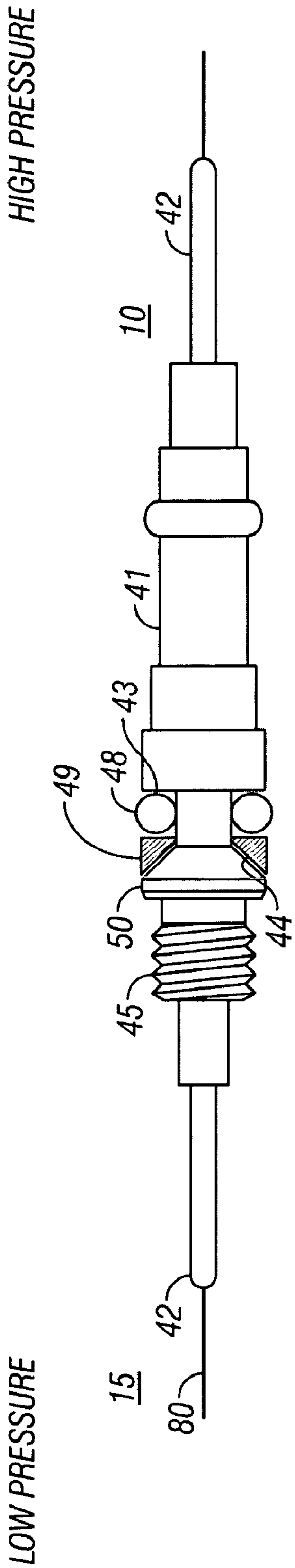
FIG. 4 is a sketch of a connector having a beveled back-up ring according to one embodiment of the present invention.
Figure 5:
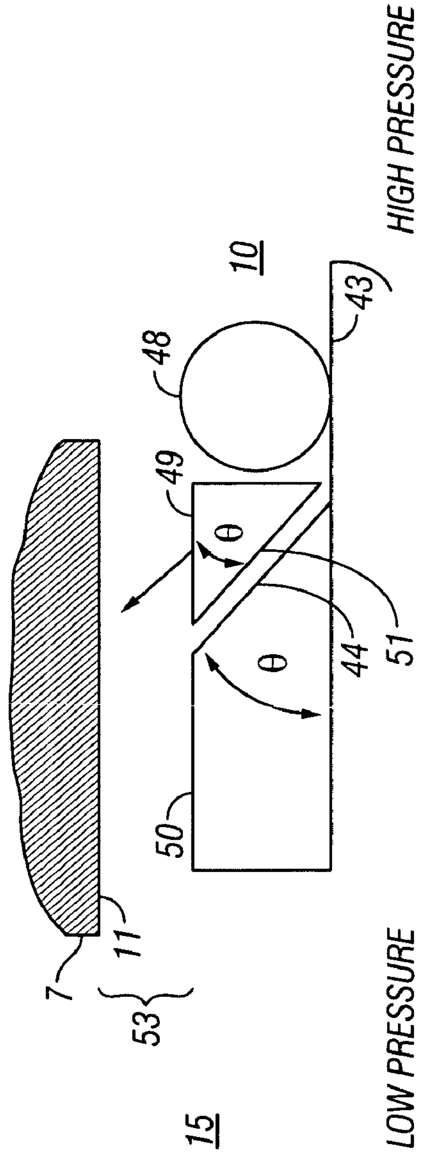
FIG. 5 is a sketch showing the details of the back-up ring of FIG. 4.

In order to transfer the electrical power and signals between wireline 12 and tool string 18, a connector is used. According to one embodiment, connector 40, see FIG. 4, is inserted in a suitable port similar to that shown in FIG. 2. Connector 40 may be of similar internal construction to any of the connectors described as prior art. Connector body 41 has connector pin 42 extending therethrough and conducts energy from the high fluid pressure area 10 to the low fluid pressure area 15, where the high pressure is the downhole fluid pressure and the low pressure may be atmospheric pressure. In addition, the high pressure fluid may be a liquid while the low pressure fluid may be a gas. Thus a substantial positive differential pressure is exerted across connector 40 from the high pressure end to the low pressure end. Connector pin 42 is sealed to connector body 41 using techniques known in the art. O-ring groove 43 has a conically beveled wall surface 44. Back-up ring 49 is inserted between conically beveled wall section 44 and o-ring 48. Back-up ring 49 has conically beveled surface 51 where the angle θ' is substantially the same as the angle θ of conically beveled surface 44, see FIG. 5. Angles θ and θ' are in the range of about 40° to 50° and preferably about 45°. At an angle of 45°, the axial displacement of the back-up ring is equal to the radial displacement into gap 53. Angle θ is referenced to the bottom of groove 43 where the bottom of groove 43 is also substantially parallel to a centerline 80 through the connector. As shown in FIG. 5, high pressure acting on o-ring 48 forces o-ring 48 against back-up ring 49 subsequently forcing back-up-ring 49 up conically beveled surface 44 and into gap 43 between shoulder 50 and surface 11 of bulkhead 7. Back-up ring 49 is scarf cut to allow expansion as it moves up conically beveled surface 44. O-ring 48 continues to force back-up ring 49 into gap 53 until back-up ring 49 contacts surface 11. When back-up ring 49 is forced into contact with surface 11, there is essentially no extrusion gap for o-ring 48 to move into, thereby preventing extrusion damage and failure to o-ring 48. Back-up ring 49 is made of a material that retains sufficient mechanical strength at the downhole temperature while in contact with the different downhole fluids. Back-up ring 49 may be made of a thermoplastic such as polyether ketone (PEK), polyetherether ketone (PEEK), or any other suitable thermoplastic material. Alternatively, back-up ring 49 may be made of a metallic material. O-ring 48 may be made of any elastomer material suitable for the downhole temperature, pressure, and fluid chemistry conditions. Such materials include, but are not limited to, perfluoroelastomers and tetrafluroethylene-propylene elastomers known in the art. While described above for a single conductor connector, multiple conductor connector bodies are within the scope of the present invention. While described above in relation to an elastomer o-ring, the present invention encompasses other shape elastomer seals suitable for insertion in such a groove. This includes, but is not limited to square-shaped, oval-shaped, and rectangular-shaped elastomer seals, where the shape refers to the cross-sectional shape of the seal.

Figure 6:
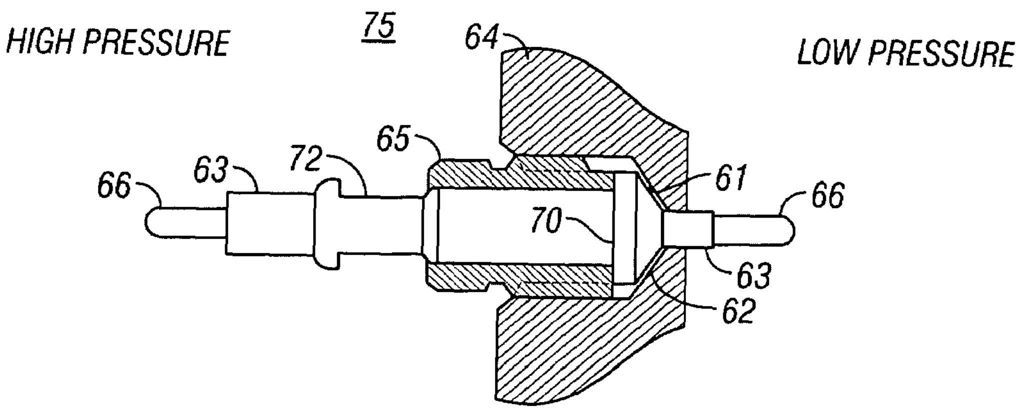
FIG. 6 is a sketch of a connector having a metal-to-metal seal according to one embodiment of the present invention.
Figure 7:
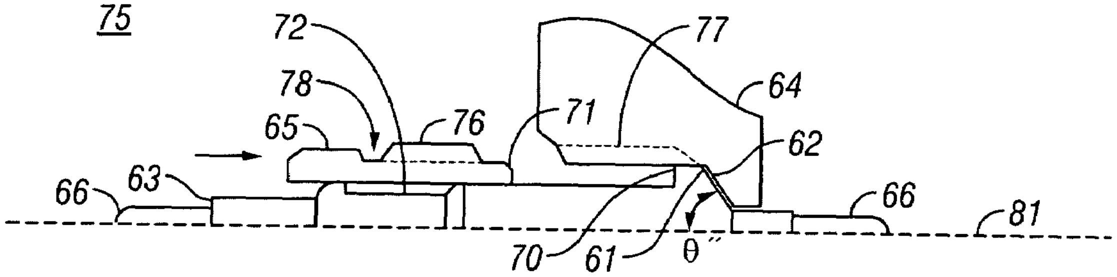
FIGS. 7 and 8 are exploded views of the connector of FIG. 6.
Figure 8:
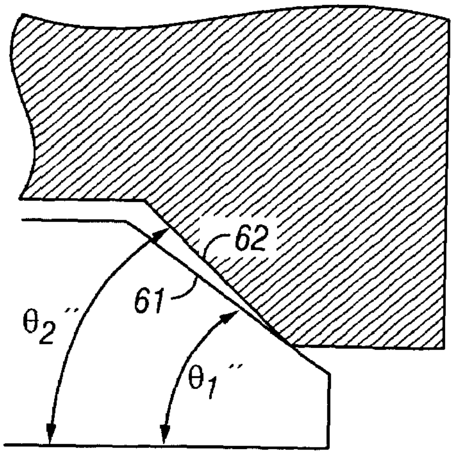

In another embodiment, see FIGS. 6 and 7, seal assembly 75 comprises a conductor 66 sealed to and surrounded by insulator 63 that is disposed in connector body 72. Connector body 72 has a conically tapered nose surface 61 that contacts a similarly conically tapered bulkhead sealing surface 62 in bulkhead 64. Locking nut 78 is threaded into bulkhead 64 by engagement of threads 76 and 77, and locking nut shoulder 71 contacts connector body shoulder 70 forcing nose surface 61 into contact with bulkhead sealing surface 62. Angle θ" is in the range of about 25° to 35° and preferably about 30°. As shown in FIG. 8, angles $\theta_1$" and $\theta_2$" may be different by about 1–2° to ensure a circumferential line contact between surfaces 61 and 62 enabling a more controlled metal-to-metal seal.

End 65 of locking nut 78 is shaped to form a hex nut shape or other suitable shape to allow sufficient tightening of locking nut 78 in bulkhead 64 to effect a circumferential metal-to-metal seal between the conical surfaces 61 and 62. Connector body 72 may be made of a metal material, or alternatively, a thermoplastic material, such as, for example, those described previously. Locking nut 78 is made from a metal material suitable for downhole use.

While described above in relation to wireline type tools, it is intended that the scope of the present invention encompasses such a connector in Measurement-While-Drilling tools and completion and production tools, as well. Such a connector may also be used in subsea applications. In addition, the sealing mechanisms and methods described herein may be used on hydraulic connectors, optical fiber connectors, and any suitable feedthrough that requires a reliable seal between a high pressure fluid and a low pressure fluid. Note that a low pressure fluid encompasses pressures below atmospheric pressure.

While there has been illustrated and described a particular embodiment of the present invention, it will be appreciated that numerous changes and modifications will occur to those skilled in the art, and it is intended in the appended claims to cover all those changes and modifications.

What is claimed is:

1. An electrical connector system for use in a downhole environment, comprising:

a connector body positioned in a tool body conveyed into the downhole environment;

a first substantially conical surface formed on a first end of the connector body and having a first angle relative to an axis of the connector body;

a second substantially conical surface formed in a port of a bulkhead and having a second angle relative to an axis of the connector body, the first and second angles selected to provide a line contact between the first substantially conical surface and the second substantially conical surface;

a locking nut threadedly engagable with the bulkhead ,the locking nut forcing the first conical surface in contact with the second conical surface to form a seal when the locking nut is threadedly engaged with the bulkhead.

2. The electrical connector of claim 1, further comprising a conductor pin sealably disposed through the connector body.

3. The electrical connector of claim 1, wherein the connector body is made from a material chosen from the group consisting of (i) a metal and (ii) a thermoplastic.

4. The electrical connector of claim 1, wherein the first conical surface and the second conical surface form an angle with a centerline of the connector of about 25°–35°.

5. The electrical connector of claim 1, wherein a first angle of the first conical surface and a second angle of a second conical surface differ by less than 3°.

6. The electrical connector system of claim 1, wherein the connector body comprises a substantially cylindrical section.

7. A system for performing one or more operations in a wellbore drilled in a subterranean formation, comprising:

(a) a conveyance device;

(b) a tool coupled to the conveyance device;

(c) a conductor associated with the tool for conducting one of power and data (d) a connector body connected to the conductor, the connector body comprising:

(i) a first substantially conical surface formed on a first end of the connector body and having a first angle relative to an axis of the connector body;

(ii) a second substantially conical surface formed in a port of a bulkhead and having a second angle relative to an axis of the connector body, the first and second angles selected to provide a line contact between the first substantially conical surface and the second substantially conical surface;

(iii) a locking nut threadedly engagable with the bulkhead, the locking nut forcing the first conical surface in contact with the second conical surface to form a seal when the locking nut is threadedly engaged with the bulkhead.

8. The system of claim 7 wherein the locking nut having a shoulder abutting a connector body shoulder and forcing the first conical surface in contact with the second conical surface to form a seal.

9. The system of claim 7, wherein the first conical surface and the second conical surface form an angle with a centerline of the connector of about 25°–35°.

10. The system of claim 7, wherein the conveyance device is a wireline.

* * * * *

UNITED STATES PATENT AND TRADEMARK OFFICE

CERTIFICATE OF CORRECTION

PATENT NO. : 7,226,303 B2
APPLICATION NO. : 11/062383
DATED : June 5, 2007
INVENTOR(S) : Farhat Shaikh It is certified that error appears in the above-identified patent and that said Letters Patent is hereby corrected as shown below:

Column 6, line 1, change “The electrical connector of claim 1, wherein a first” to --The electrical connector of claim 1, wherein the first--;

Column 6, line 2, change “angle of the first conical surface and a second angle of a” to --angle of the first conical surface and the second angle of the--;

Column 6, line 30, change “The system of claim 7 wherein the locking nut having” to --The system of claim 7 wherein the locking nut has--; and Column 6, line 31, change “a shoulder abutting a connector body shoulder and forcing” to --a shoulder abutting a connector body shoulder and forces--.

Signed and Sealed this

Twentieth Day of May, 2008

JON W. DUDAS
*Director of the United States Patent and Trademark Office*